United States Patent [19]
Uhling et al.

[11] Patent Number: 5,392,001
[45] Date of Patent: Feb. 21, 1995

[54] CAPACITIVELY-COUPLED AMPLIFIER WITH IMPROVED LOW FREQUENCY RESPONSE

[75] Inventors: Thomas F. Uhling, Monument; John M. Heumann, Loveland; Ronald J. Peiffer, Fort Collins, all of Colo.

[73] Assignee: Hewlett-Packard Company, Palo Alto, Calif.

[21] Appl. No.: 202,329

[22] Filed: Feb. 28, 1994

[51] Int. Cl.6 .................... H03F 1/38; G01R 1/30
[52] U.S. Cl. .................... 330/156; 324/123 C; 330/76; 330/85; 330/112; 330/292; 330/294
[58] Field of Search .......... 330/76, 85, 112, 156, 330/291, 292, 294; 324/123 C

[56] References Cited
U.S. PATENT DOCUMENTS
5,274,336 12/1993 Crook et al. .

FOREIGN PATENT DOCUMENTS
1139155 11/1962 Germany .................. 330/291
128615 6/1986 Japan ...................... 330/156

OTHER PUBLICATIONS
Dragun, "Transistorized Remote Amplifier for the S1-11 Oscillograph," *Instrum. & Exp. Tech.*, No. 3, May., Jun. 1970, pp. 948-949.
Horn, "Feedback Reduces Bio Probes Input Capacitance," *Electronics*, Mar. 18, 1968, pp. 97, 98.

*Primary Examiner*—James B. Mullins

[57] ABSTRACT

A capacitively-coupled amplifier circuit includes an amplifier for receiving an input signal via a coupling capacitance and for amplifying the input signal to produce an output signal. A resistor provides a bias voltage to the amplifier. The resistor is bootstrapped using positive feedback with a loop gain of slightly less than one. The bootstrapping causes an increase in the value of the resistor to lower the cut-in (pole) frequency of the amplifier. The bootstrapping or feedback circuit includes a roll-off (pole) at a frequency below the roll-off (pole) frequency of the amplifier. This prevents phase shift in the feedback loop from adversely effecting the high frequency response of the amplifier. The resulting amplifier circuit exhibits a wide passband and excellent low frequency response despite having a capacitively coupled input signal.

10 Claims, 8 Drawing Sheets

CAPACITIVELY-COUPLED AMPLIFIER WITH IMPROVED LOW FREQUENCY RESPONSE

BACKGROUND OF THE INVENTION

1. Field of the Invention

This invention relates generally to the field of amplifier circuits and, more particularly, to a capacitively-coupled, wide bandwidth amplifier.

2. Related Art

A non-contact or capacitively-coupled test probe allows the probing of traces and other conductors on a circuit board without physical contact. Probing without physical contact allows signals to be picked-up through solder resist or conformal coating and reduces the probability of physical damage to the conductor being probed. Commonly owned U.S. Pat. No. 5,274,336 to Crook et al. (hereinafter the '336 patent), the full text of which is incorporated herein by reference as if reproduced in full below, discloses a capacitively-coupled test probe for non-contact acquisition of both analog and digital signals.

The probe disclosed in the '336 patent includes a probe body, a probe tip and an amplifier circuit within the probe body. The probe tip has ultra fine dimensions (e.g., a diameter on the order of 10 mils or less). This ultra fine probe tip can be used to probe the ultra fine trace geometries used on modern printed circuit boards and minimizes the capacitive loading on the circuit being probed.

A problem with capacitively-coupled probes such as that described in the '336 patent is that it is often difficult to produce sensed signals having usable amplitudes. This occurs because a capacitively-sensed signal will be attenuated by the proportion of the coupling capacitance (between the probe tip and the conductor being probed) to the sum of the input capacitance of the probe and the coupling capacitance. The coupling capacitance of the probe is proportional to the surface area of the active region of the probe tip (which acts as a capacitor plate) held in close proximity to the conductor being probed. Thus, for a fixed input capacitance, the smaller the size of the probe tip, the weaker will be the capacitively-sensed signal.

If the probe size is very small, then the signal may be attenuated beyond that which can be successfully discriminated from the electrical noise of the amplifier circuit. For example, an ultra fine probe tip as taught by the '336 patent may exhibit a coupling capacitance on the order of 10 fF (femtoFarads). The input capacitance of the probe is on the order of 1.0 pF (picoFarads). This will result in a factor of 100 (10 fF/1 pF) attenuation of the input signal.

Another problem which results from the signal being sensed through a coupling capacitance is that the transfer function of the amplifier circuit will exhibit a zero at zero hertz and a pole at some (relatively low) frequency $f_1$. Thus, input signals will be differentiated at frequencies below $f_1$. The location ($f_1$) of the pole is dictated by the input capacitance and the input resistance of the probe.

In addition, the amplifier circuit of the probe will exhibit a pole at some (relatively high) frequency $f_2$. The location ($f_2$) of the high frequency pole is dictated by parasitic impedances within active devices of the amplifier circuit.

The region between the low and high frequency poles ($f_1$ to $f_2$) represents the passband of the probe or, more specifically, of the amplifier. It is desirable to improve the low frequency response of the amplifier by moving $f_1$ down in frequency. However, frequency $f_1$ is inversely proportional to the product of the input capacitance and the input resistance of the amplifier. Thus, in order to decrease $f_1$, the product of the input capacitance and input resistance must be made larger. If the value of input capacitance is increased, however, then the attenuation problem discussed directly above will be worsened. Moreover, the input resistor provides a bias current to a first transistor stage of the amplifier. In order to provide the required bias current, the value of the input resistor ordinarily cannot be increased beyond a certain value. In addition, increasing the input resistance will increase the Johnson noise of the amplifier circuit. As a result, the low frequency response of known capacitively-coupled amplifier circuits is often poor (i.e., having a relatively high value of $f_1$).

It is known to bootstrap the input capacitance of a capacitively-coupled amplifier to improve the low frequency response. This will make the input capacitance appear smaller than its actual value. As a result, the passband gain and the low frequency response will be improved. These improvements, however, are attained at the cost of reduced amplifier bandwidth (i.e., the high frequency pole moves down in frequency). In addition, the bootstrapping feedback loop must have a frequency response which is active throughout the passband of the amplifier. The stabilization of such a high frequency feedback loop is difficult, and ringing, oscillation and other problems can easily result.

What is needed is an amplifier circuit for use with capacitively-coupled inputs, such as those encountered with a non-contact probe, which exhibits a low input capacitance, a high gain, a good low frequency response, and a wide signal bandwidth to overcome the limitations of known amplifier circuits.

SUMMARY OF THE INVENTION

The invention is a stable, capacitively-coupled amplifier circuit which exhibits wide bandwidth and good low frequency response despite having a capacitively-coupled input. The amplifier circuit includes an amplifier for receiving an input signal through a coupling capacitance and for amplifying the input signal to produce an output signal. A resistor provides a bias current to the amplifier. The resistor is bootstrapped using positive feedback with a loop gain of slightly less than one. The bootstrapping causes an increase in the effective value of the resistor to lower the frequency ($f_1$) of the amplifier, thereby extending the low frequency response of the amplifier circuit. The transfer function of the bootstrapping circuit includes a pole at a frequency ($f_{FB}$) below the roll-off frequency ($f_2$) of the amplifier (i.e., $f_1 < f_{FB} < f_2$). Thus, the bootstrapping will effectively be removed from the amplifier circuit at some mid frequency $f_{FB}$ so that the high frequency response of the amplifier is not affected. If is preferred that $f_{FB}$ be several decades below $f_2$. The resulting amplifier circuit exhibits a good low frequency response and high bandwidth despite having a capacitively coupled input signal. The foregoing and other objects, features and advantages of the invention will be apparent from the following, more particular description of a preferred embodiment of the invention, as illustrated in the accompanying drawings.

DETAILED DESCRIPTION OF THE PREFERRED EMBODIMENT

The preferred embodiment of the invention is discussed in detail below. While specific part numbers and/or configurations are discussed, it should be understood that this is done for illustration purposes only. A person skilled in the relevant art will recognize that other components and configurations may be used without parting from the spirit and scope of the invention.

Figure 1:
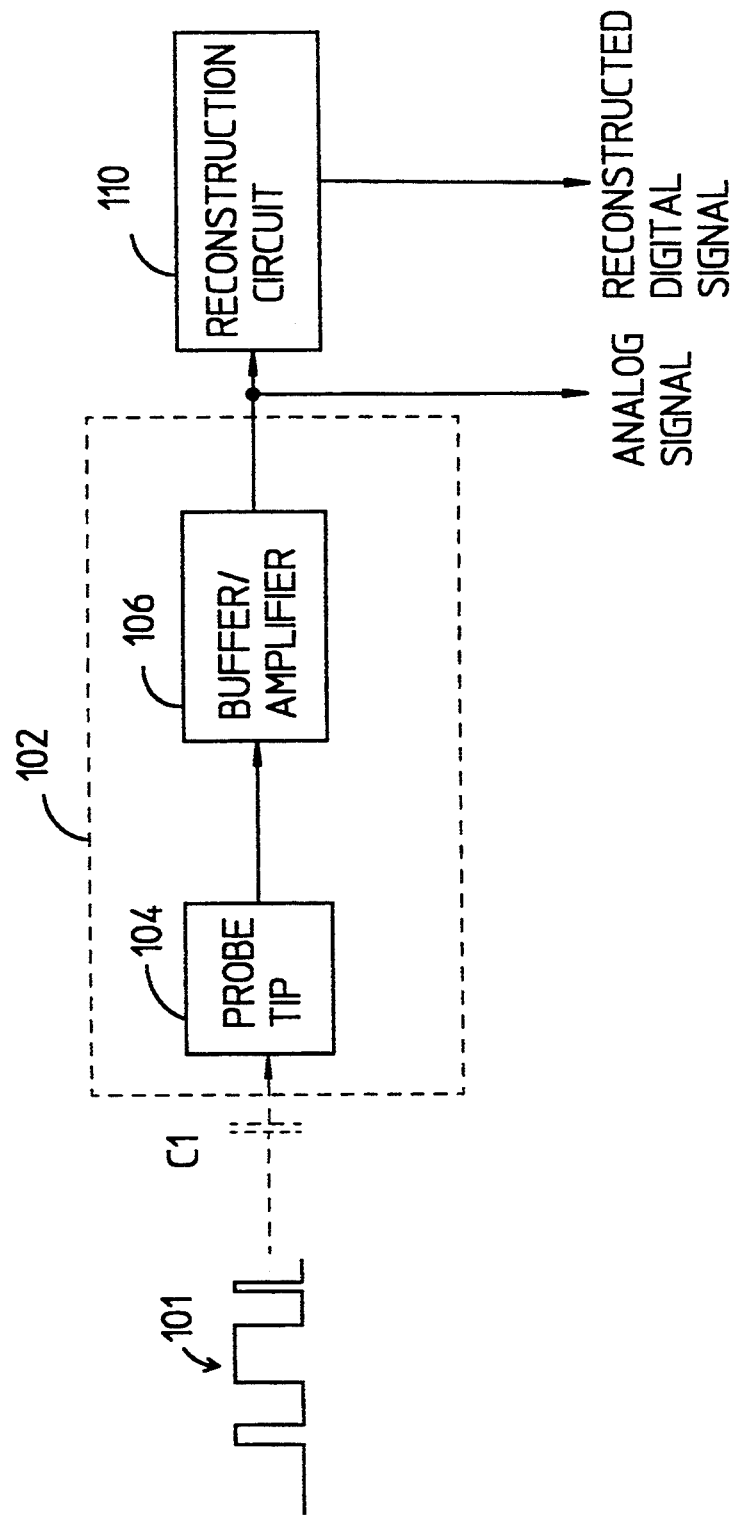
FIG. 1 is a block diagram illustrating a capacitively coupled probe and reconstruction circuit such as that disclosed in U.S. Pat. No. 5,270,236 to Crook et al.

The preferred embodiment of the invention is now described with reference to the figures. FIG. 1 is a high-level block diagram of a capacitively-coupled probe such as that described in the '336 patent. Probe 102 includes a probe tip 104 and a buffer/amplifier circuit 106. An analog or digital signal 101 is capacitively sensed by probe 102 via probe tip 104. A coupling capacitance present between probe tip 104 and the conductor carrying signal 101 is represented by a capacitor C1.

Amplifier circuit 106 amplifies/buffers the sensed signal. Amplifier circuit 106 may have a gain less than, equal to, or greater than unity. The amplified signal may, for example, be viewed on an oscilloscope, a distortion meter, or a spectrum analyzer. Alternatively, for digital signals, a reconstruction circuit 110 may be used to reconstruct the original digital signal. Reconstruction is required because capacitor C1 will high-pass filter or differentiate components of signal 101 below $f_1$.

Figure 2:
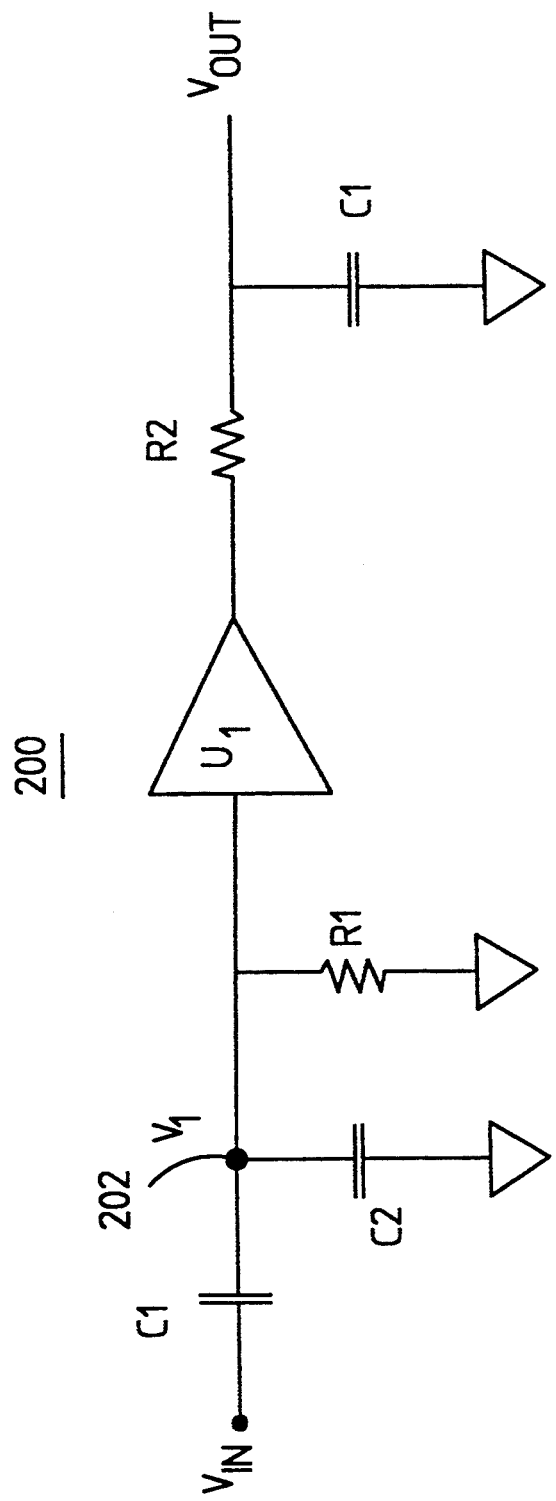
FIG. 2 is a simplified schematic diagram of a conventional capacitively-coupled amplifier circuit.

A conventional implementation 200 of amplifier circuit 106 is illustrated in FIG. 2. Amplifier circuit 200 includes an active amplifier U1. Coupling capacitor C1 is illustrated as coupling an input signal $V_{IN}$ to amplifier U1. The input capacitance and the input resistance of amplifier U1 are represented by capacitor C2 and resistor R1, respectively. Capacitor C2 represents the input capacitance of the amplifier U1 itself, the capacitance of probe tip 104, as well as any distributed or parasitic capacitance introduce between probe tip 104 and amplifier circuit 200.

As discussed above, $V_{IN}$ is attenuated by the proportion of C1 to the sum of C1 and C2 to produce a voltage $V_1$ at a node 202. The '336 patent discusses ways to minimize the value of C2 (which is generally several orders of magnitude larger than the value of C1 when used with an ultra fine probe tip such as that described in the '336 patent). Minimizing the value of C2, however, will move the low frequency pole of the amplifier circuit up in frequency, thus, limiting the low frequency response of amplifier circuit 200.

Optimally, the bandwidth of amplifier U1 would extend from 0 Hz to a frequency (e.g., $10^9$ Hz) greater than the fastest signal to be sensed and would have a constant gain over the entire bandwidth. Unfortunately, this is not possible. Because the test signal is being acquired through capacitor C1, the transfer function of the amplifier circuit has a zero at 0 Hz and a pole at some low frequency $f_1$. This causes signal frequencies below frequency $f_1$ to be attenuated. Additionally, the amplifier circuit has a characteristic high frequency pole which is caused by parasitic impedances within the active devices of amplifier U1. This high frequency pole, located at a frequency $f_2$, is modeled by a resistor R2 and a capacitor C3. The frequency span $f_1$ to $f_2$ over which the gain of the amplifier is relatively stable is known as the "bandwidth" of the amplifier.

In order to provide a wide bandwidth, it is desirable to decrease frequency $f_1$ to as low a frequency as possible and to maintain $f_2$ at as high a frequency as possible. For sensing digital signals, the high frequency response of the amplifier is much more important than the low frequency response. A good high frequency response is required in order to follow the fast transition edges of an input signal. The low frequency component (which is lost in the differentiation caused by coupling capacitor C1) of the digital signals consists primarily of near DC frequencies which can be reconstructed using reconstruction circuit 110. For sensing analog signals, it is normally desired to preserve the low frequency components to the greatest extent possible.

For amplifier circuit 200, the frequency $f_1$ of the low frequency pole is determined as follows:

$$f_1 = \frac{1}{2\pi R_1 C_{IN}}$$

where: $C_{IN}$ = total input capacitance
$= C1 + C2$

In order to minimize frequency $f_1$, the product of R1 and C2 should be made as large as possible (i.e., amplifier U1 should have a large input resistance). However, the attenuation considerations discussed above prohibit increasing the size of capacitor C2. Moreover, R1 provides a bias current to amplifier U1. In order to provide the required bias current, the value of R1 ordinarily cannot be increased beyond a certain value. In addition, increasing the value of R1 will increase the Johnson noise of the amplifier circuit. Accordingly, it is difficult to obtain a good low frequency response from amplifier circuit 200.

When given a capacitively-coupled input, the inventors have found that producing an amplifier circuit with the required gain and a bandwidth wide enough for use with both analog and fast digital signals is difficult using conventional design techniques. In looking to solve the problems associated with known amplifier circuits, the inventors have developed a new amplifier configuration.

Figure 3:
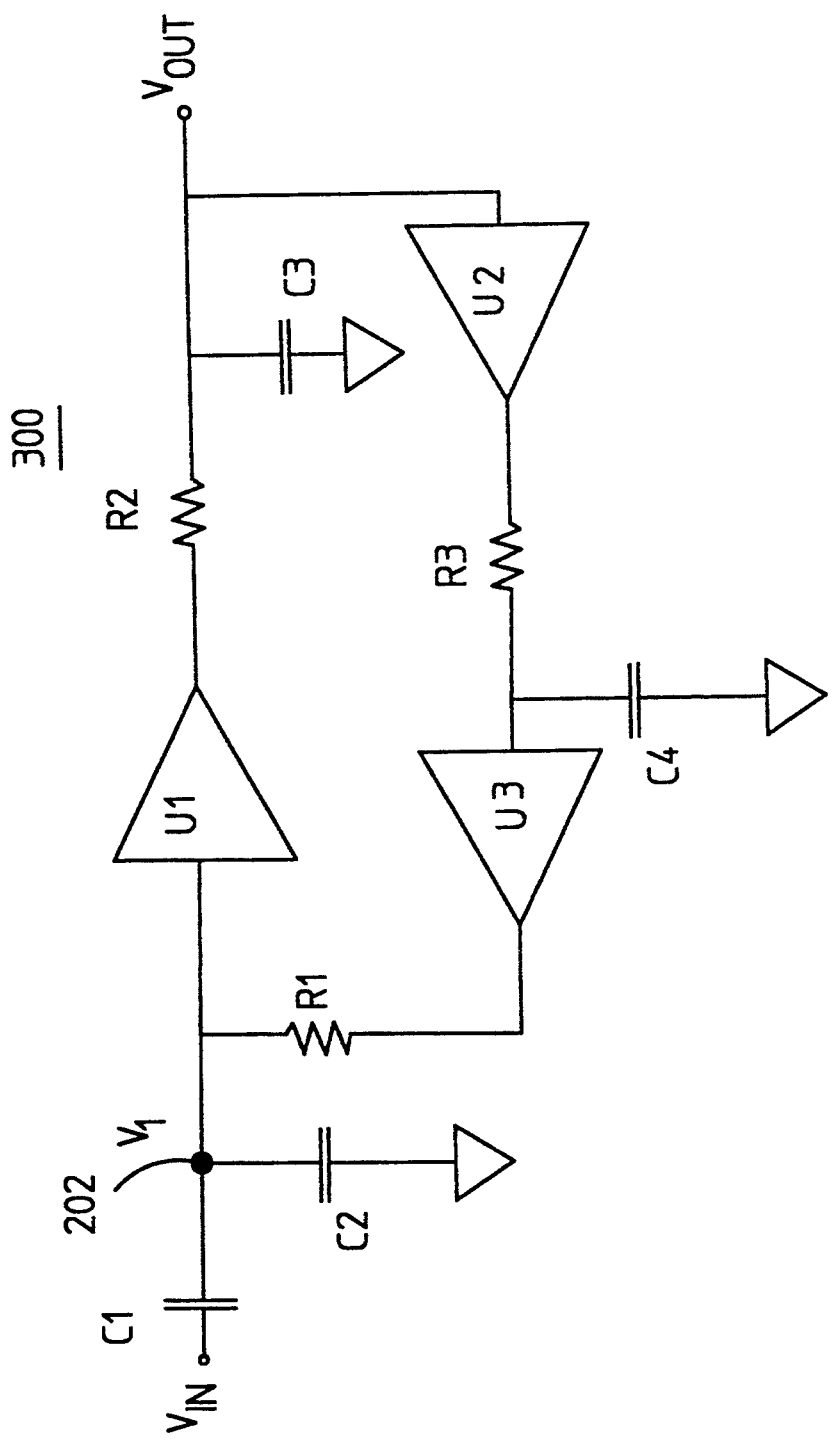
FIG. 3 is a schematic diagram of the capacitively-coupled amplifier circuit of the present invention.

FIG. 3 is a simplified schematic diagram illustrating an amplifier circuit 300 according to the invention. As in amplifier circuit 200, amplifier circuit 300 includes a coupling capacitor C1 (modeling coupling capacitance), an input capacitor C2, an input resistor R1, an amplifier U1, an output resistance R2 (modeling the parasitic impedances which limit the high frequency response of the active devices in the amplifier) and an output capacitance C3 (modeling the parasitic impedances which limit the high frequency response of the active devices in the amplifier). Note, however, that resistor R1 is not connected to ground as in amplifier circuit 200. Rather, resistor R1 is "bootstrapped."

Bootstrapping involves the use of positive feedback with a loop or feedback gain of less than one to increase the effective value of resistor R1. In amplifier circuit 300, bootstrapping is accomplished using an amplifier U2, a resistor R3, a capacitor C4 and an amplifier U3. The gain values for amplifiers U2 and U3 are selected such that the loop gain (i.e., the total gain in the feedback loop including the forward gain of amplifier U1) is less than but preferably very close to unity. This is accomplished by making the combined gain of amplifiers U2 and U3 approximately equal to but slight less than the inverse of the gain of amplifier U1.

For example, in amplifier circuit 200, for a voltage $V_1$ at the input of amplifier U1, the current through resistor R1 will be equal to $V_1/R1$. In contrast, in amplifier circuit 300, with bootstrapping active and a loop gain of 0.99, a voltage $V_1$ at the input of amplifier U1 would yield a current through resistor R1 of $(V_1-0.99 V_1)/R_1$. This simplifies to $V_1/(100\ R_1)$. Thus, in amplifier circuit 300 with bootstrapping, resistor R1 has an effective value 100 times greater than that displayed by R1 in amplifier circuit 200. Thus, a 100 times (i.e., two decades) reduction in the frequency of the low frequency pole can be achieved. This use of feedback improves the low frequency response of the amplifier without effecting the high frequency response. As a result, the amplifier circuit is allowed to approach the gain bandwidth product of the underlying active devices.

Resistor R3 and capacitor C4 produce a pole at some intermediate frequency $f_{FB}$. Frequency $f_{FB}$ is selected to have a value which lies between the frequency $f_1$ of the low frequency pole and the frequency $f_2$ of the high frequency pole. This intermediate pole functions to phase out the bootstrapping of resistor R1 at the frequency $f_{FB}$ to prevent phase shift in the feedback loop from adversely effecting the high frequency performance of the amplifier circuit. This phase-out of the bootstrapping at a mid frequency makes amplifier circuit 300 straightforward to stabilize. If the feedback loop were allowed to remain active at high frequencies, then many potential stability problems arise. For example, at higher frequencies parasitic impedances may provide "sneak paths" for additional feedback. If the additional feedback results in unity loop gain, then the amplifier circuit may become unstable.

As discussed below, amplifier circuit 300 was modeled as illustrated in FIG. 3 specifically for computer-aided circuit analysis using SPICE circuit analysis software. Amplifier U2 was inserted solely for the simulation to isolate resistor R3 and capacitor C4 from adversely effecting the high frequency pole of amplifier U1. In practice amplifier U2, resistor R3 and resistor C4 may be eliminated. The mid-frequency pole may be implemented via the internal frequency limitations of amplifier U3. Thus, by selecting a relatively low bandwidth amplifier to implement amplifier U3, the circuit is greatly simplified.

Figure 4:
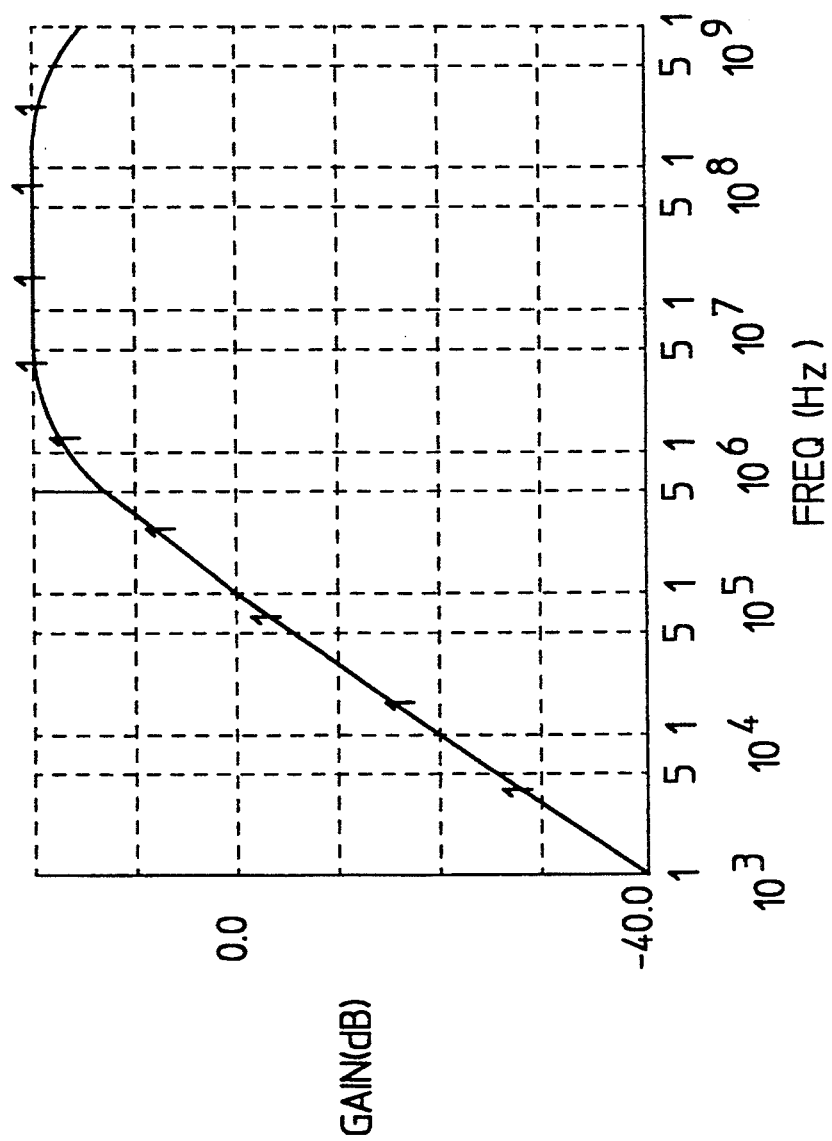
FIG. 4 is a Bode plot (frequency versus gain) from a SPICE simulation for the circuit illustrated in FIG. 2.

The frequency response and transient response characteristics of amplifier circuits 200,300 were analyzed using SPICE and the results compared. For the circuit of FIG. 2, the following component values were selected: C1=10 fF, C2=1 pF, R1=159.155 KΩ, R2=1 Ω, and C3=159.155 pF. The results of the SPICE frequency response analysis for amplifier circuit 200 are illustrated in FIG. 4. As illustrated, amplifier circuit 200 exhibits a low frequency pole ($f_1$) at approximately 1.0 MHz and a high frequency pole at approximately 1.0 GHz.

The SPICE simulation of amplifier circuit 300 was performed using similar values for components C1, C2, R1, R2 and C3 as amplifier circuit 200. In addition, amplifiers U1 and U2 were assigned a gain of one, and amplifier U3 was assigned a gain of 0.99. This provided 100 times bootstrapping for the value of resistor R1. In addition, resistor R3 was assigned a value of 1 ohm and capacitor C4 was assigned a value of 1.59155 nF. These values of components R3 and R4 resulted in a bootstrapping roll-off or cutout frequency of 100 MHz.

Figure 5:
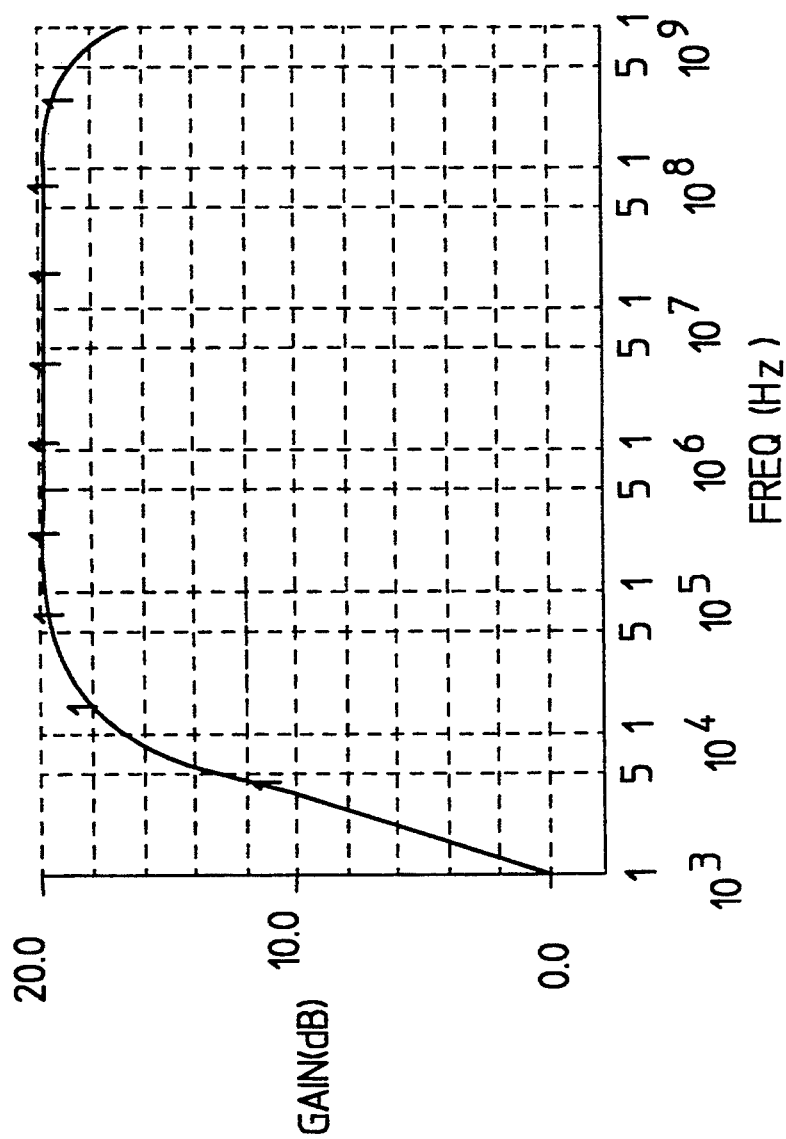
FIG. 5 is a Bode plot (frequency versus gain) from a SPICE simulation for the circuit illustrated in FIG. 3.

The SPICE simulated frequency response for amplifier circuit 300 is illustrated in FIG. 5. As can be seen from inspection of the curve of FIG. 5, amplifier circuit 300 exhibits a low frequency pole at 10 KHz and a high frequency pole at 1.0 GHz. Thus, amplifier circuit 300 exhibits a low frequency pole at a frequency 100 times (2 decades) lower than that exhibited by amplifier circuit 200.

Figure 6:
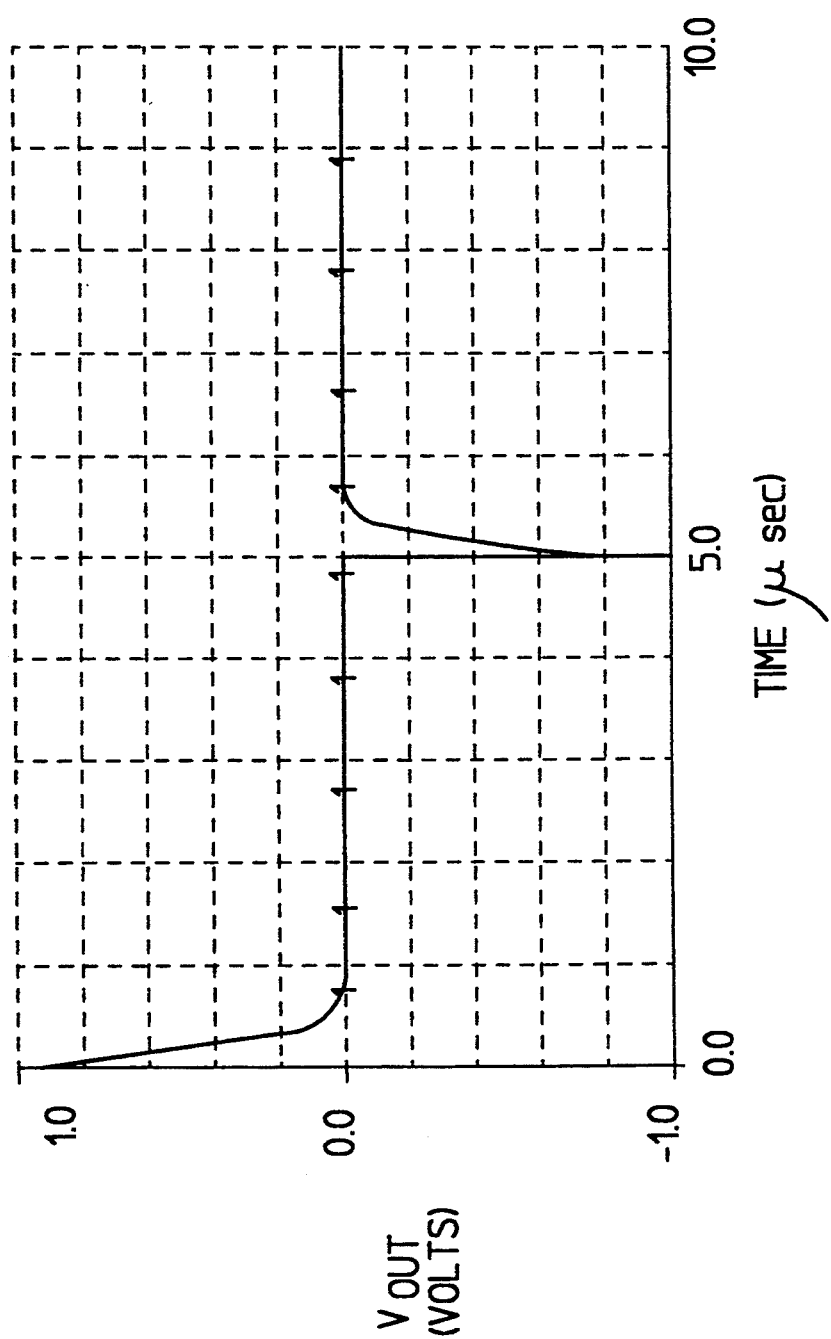
FIG. 6 illustrates a SPICE simulation of the transient response of the circuit of FIG. 2.

For the transient analysis, each amplifier circuit was subjected to an input pulse of 5.0 μsec (microseconds) duration with 1.0 nsec (nanosecond) rise and fall times. FIG. 6 illustrates the response (output) of amplifier circuit 200 to this input pulse. Note that the amplifier circuit accurately captures the fast edges of the input but loses the low frequency information (i.e., the portion of the pulse occurring between the two edges).

Figure 7:
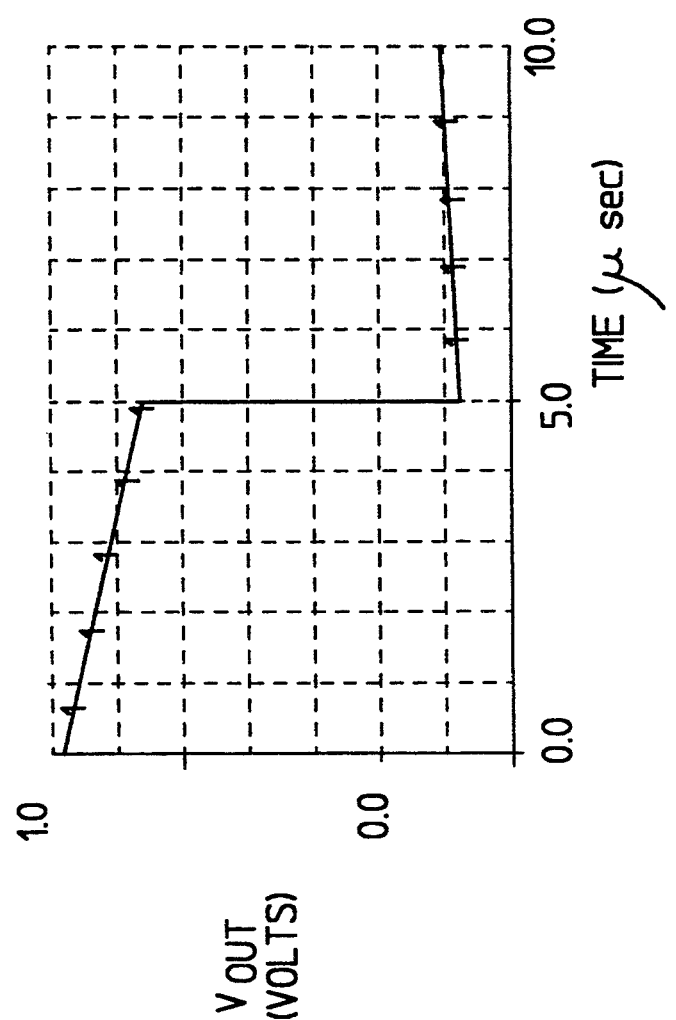
FIG. 7 illustrates a SPICE simulation of the transient response of the circuit of FIG. 3.

FIG. 7 illustrates the response of amplifier circuit 300. As with amplifier circuit 200, amplifier circuit 300 accurately captures the fast edges of the input signal. However, unlike amplifier circuit 200, amplifier circuit 300 also captures (to a much greater extent) the low frequency portion of the pulse.

Figure 8:
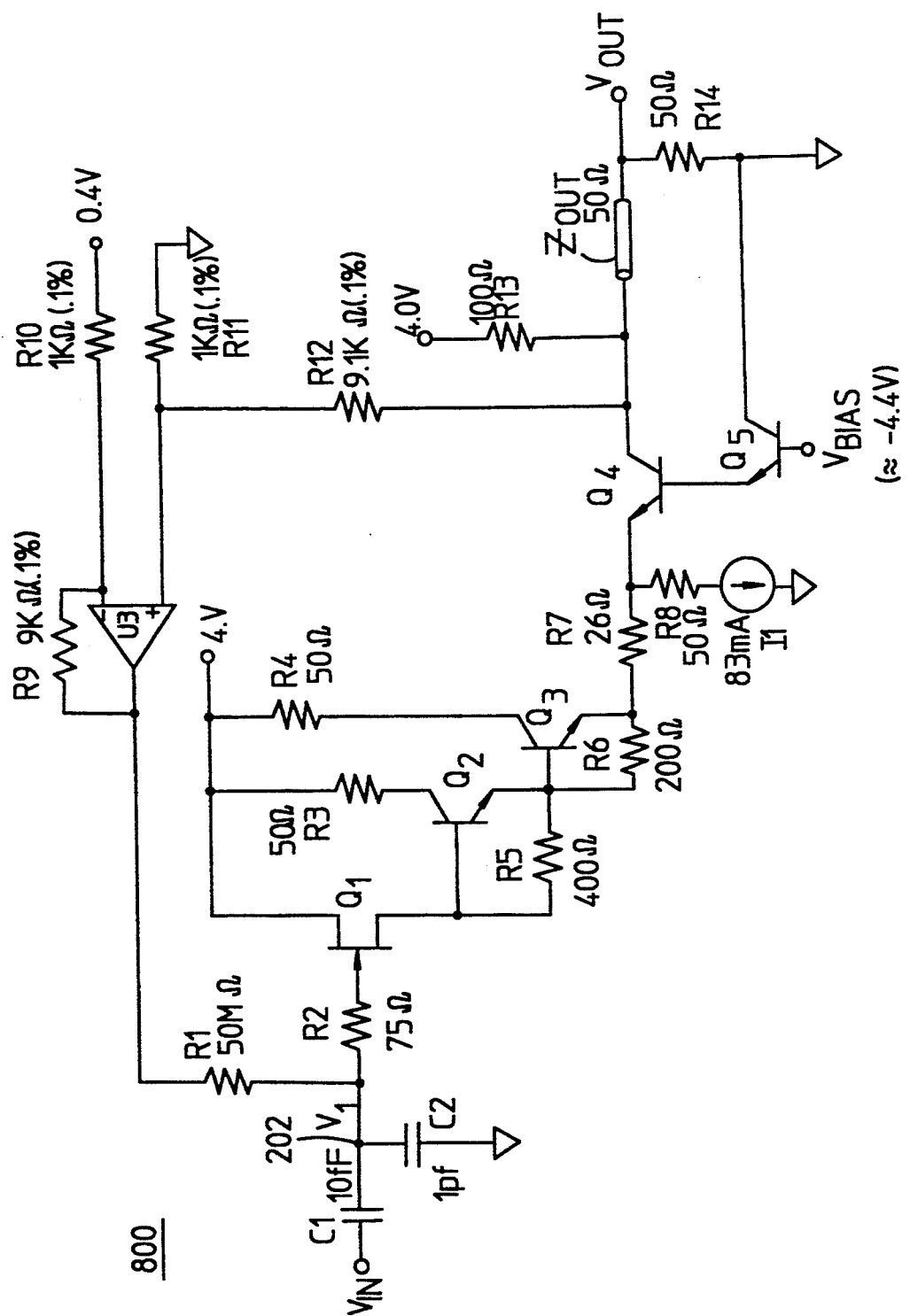
FIG. 8 is a schematic diagram of an example embodiment of the circuit of FIG. 3.

An example implementation 800 of amplifier circuit 300 is shown in FIG. 8. Amplifier circuit 800 includes transistors Q1-Q5, operational amplifier U3, current source I1 and resistors R1-R13. The coupling capacitance is represented by capacitor C1, and the input capacitance is represented by capacitor C2. A 50 Ω coaxial cable connecting amplifier circuit 800 to an oscilloscope or other electronic equipment is represented by $Z_{out}$. Resistor R14 represents the internal matching impedance of the oscilloscope or other equipment.

Q1 is an N-channel JFET (junction field effect transistor) providing a high input impedance for amplifier circuit 800. Transistors Q2 and Q3 are NPN BJTs (bipolar junction transistors) connected as emitter followers to provide a relatively high impedance at the source of transistor Q1. This impedance causes Q1 to operate in a linear fashion so that amplifier circuit 800 can operate as a unity gain amplifier. Resistors R2, R3 and R4 are damping resistors. Resistors R3 and R4 provide damping by increasing the Miller capacitance of transistors Q2 and Q3. Resistor R5 provides a bias current for transistor Q1. Resistor R6 provides a bias current for transistors Q1 and Q2.

Transistors Q4 and Q5 are NPN BJTs connected in a common base configuration and operate to maintain a zero volt bias level on the output of amplifier circuit 800. A voltage $V_{BIAS}$ at the base of transistor Q5 controls transistors Q4 and Q5. $V_{BIAS}$ is produced by a feedback loop (not shown) which uses an operational amplifier to monitor the output voltage of amplifier circuit 800. The feedback loop (connected between $V_{OUT}$ and the base of transistor Q5) is responsive only to very low frequencies (near DC) such that output signals of interest are not inadvertently filtered.

Resistor R13 provides a bias voltage to the collector of Q4. Current source I1 and resistor R8 provide a compliance voltage to the emitter of transistor Q4. This compliance voltage allows amplifier circuit 800 to adjust so that it can maintain a zero volt bias at its output in response to changing circuit conditions.

Resistor R7 sets the gain of amplifier circuit 800. With the common base configuration of transistors Q4 and Q5, the gain of transistor Q4 is equal to the ratio of the collector resistance to the emitter resistance (i.e., $R_C/R_E$). For the values illustrated, the DC gain of Q4 will be approximately equal to the parallel combination of R13 and R14 divided by R7 or 1.3 (33Ω/26Ω). This gain of slightly greater than unity for transistor Q4 will offset the slightly less than unity gains of transistors Q1–Q3 to produce an overall amplifier gain of unity. In practice, R7 is trimmed during testing to set the amplifier gain at unity.

Operational amplifier U3 is connected in a non-inverting amplifier configuration using resistors R9–R12. A 0.4 Volt bias is connected to the inverting input of U3. The values of resistors R9 and R10 set the gain of operational amplifier U3 at 10. However, resistors R11 and R12 will attenuate, by a factor of 10.1, the feedback voltage from the collector of transistor Q4. Therefore, the overall gain of amplifier U3 will be slightly less than unity. In the preferred embodiment, U3 is an OP27 operational amplifier available from Analog Devices. The OP27 has an 8 MHz gain bandwidth product. At a gain of 10.0, the high frequency roll-off will be at approximately 800 KHz. Thus, the bootstrapping which U3 provides to resistor R1 will be phased out after 800 KHz.

Representative values are indicated for all components. A typical coupling capacitance of 10 fF is indicated for capacitor C1. A typical amplifier input capacitance (including parasitics) of 1.0 pF is indicated for capacitor C2. Input resistance R1 has a value of 50MΩ. Input resistor R1 is bootstrapped using amplifier U3 as explained above. A loop gain of 0.99 is selected for amplifier circuit 800 to provide a 100 times bootstrap of resistor R1. The amplifier gain from input to output is set at unity. Amplifier circuit 800 will exhibit a low frequency cut-in or pole at approximately 32 Hz. The high frequency roll-off or pole is at approximately 1.0 GHz.

While amplifier circuit 800 is implemented with a JFET for transistor Q1 and with BJTs for transistors Q2–Q5, it will be apparent to a person skilled in the relevant art that amplifier circuit 800 may be implemented with other transistor types and configurations. For example, a BJT or a MOSFET (metal oxide semiconductor field effect transistor) rather than a JFET may be used for transistor Q1.

While the invention has been particularly shown and described with reference to several preferred embodiments thereof, it will be understood by those skilled in the art that various changes in form and details may be made therein without departing from the spirit and scope of the invention as defined in the appended claims.

What is claimed is:

1. A capacitively-coupled amplifier circuit comprising:
   amplifier means for receiving an input signal via a coupling capacitance and for amplifying said input signal to produce an output signal, said amplifier means having a low frequency pole at a first frequency and a high frequency pole at a second frequency;
   bootstrap means for producing a positive feedback signal from said output signal, wherein a transfer function of said bootstrap means exhibits a mid frequency pole at a third frequency between said first frequency and said second frequency; and
   bias means for providing a bias signal to an input of said amplifier means, said bias means being responsive to said positive feedback signal to modify said first frequency.

2. The capacitively-coupled amplifier circuit of claim 1, wherein said bootstrap means and said amplifier means form a feedback loop, said feedback loop having a gain not greater than one.

3. The capacitively-coupled amplifier circuit of claim 2, wherein said amplifier means comprises a first amplifier and said bootstrap means comprises a second amplifier, said second amplifier having a gain not greater than an inverse of a gain of said first amplifier.

4. The capacitively-coupled amplifier circuit of claim 3, wherein said bias means comprises a resistor connected between said input of said amplifier means and an output of said bootstrap means.

5. A capacitively-coupled amplifier circuit comprising:
   amplifier means for receiving an input signal via a coupling capacitance and for amplifying said input signal to produce an output signal, said amplifier means having a low frequency pole at a first frequency and a high frequency pole at a second frequency;
   bootstrap means for receiving said output signal from said amplifier means and for producing a positive feedback signal, said bootstrap means having a pole at a third frequency between said first frequency and said second frequency; and
   bias means, connected between an output of said bootstrap means and an input of said amplifier means, for providing a bias voltage to said amplifier means as a function of said positive feedback signal and said input signal,
   wherein said bootstrap means and said amplifier means form a feedback loop, said feedback loop having a gain not greater than one.

6. The capacitively-coupled amplifier circuit of claim 5, wherein said bias means comprises a resistor connected between said input of said amplifier means and said output of said bootstrap means.

7. The capacitively-coupled amplifier circuit of claim 6, wherein said amplifier means comprises a first amplifier and said bootstrap means comprises a second amplifier, said second amplifier having a gain not greater than the inverse of a gain of said first amplifier.

8. An amplifier circuit for use with a non-contact test probe, comprising:
   a first amplifier configured to receive an input signal via a coupling capacitance and to produce an amplified output signal, said first amplifier having a transfer function which exhibits a low frequency pole at a first frequency and a high frequency pole at a second frequency;

a second amplifier configured to receive an output of said first amplifier and to produce a positive feedback signal, said second amplifier having a transfer function which exhibits a mid frequency pole at a third frequency between said first frequency and said second frequency; and a bias resistor having a first terminal connected to an input of said first amplifier and a second terminal connected to an output of said second amplifier.

9. The amplifier circuit of claim 8, wherein said first amplifier and said second amplifier form a feedback loop, said feedback loop having a gain not greater than one.

10. The amplifier circuit of claim 9, wherein said second amplifier has a gain not greater than an inverse of a gain of said first amplifier.

* * * * *